(12) United States Patent
Jeong

(10) Patent No.: US 6,791,878 B2
(45) Date of Patent: Sep. 14, 2004

(54) WORD LINE DECODER IN NAND TYPE FLASH MEMORY DEVICE

(75) Inventor: Jong Bae Jeong, Ichon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/310,033

(22) Filed: Dec. 5, 2002

(65) Prior Publication Data

US 2003/0214842 A1 Nov. 20, 2003

(30) Foreign Application Priority Data

May 17, 2002 (KR) ................................ 10-2002-0027481

(51) Int. Cl.[7] .............................................. G11C 16/04
(52) U.S. Cl. ............................ 365/185.17; 365/185.23; 365/185.33
(58) Field of Search ....................... 365/185.17, 185.23, 365/185.33, 230.06, 185.27

(56) References Cited

U.S. PATENT DOCUMENTS 6,370,062 B2 * 4/2002 Choi ..................... 365/185.23

* cited by examiner

Primary Examiner—David Lam
(74) Attorney, Agent, or Firm—Jacobson Holman PLLC

(57) ABSTRACT

A NAND type flash memory device including a word line decoder is disclosed. The word line decoder includes a row decoder, a control unit and a driving unit. The row decoder receives an address of a given memory cell to produce a signal informing whether the memory cell is selected. The control unit outputs a positive or a negative voltage according as the memory cell was selected or not. The driving unit has NMOS transistors for outputting the negative voltage from sources to drains if the positive voltage outputted from the control unit is applied to gates of the NMOS transistors. The NMOS transistors prohibits the negative voltage inputted to the sources from being outputted to the drains if the negative voltage from the control unit is applied to the gates. The negative voltage inputted to the sources is applied to a P well of the NMOS transistors.

4 Claims, 5 Drawing Sheets

WORD LINE DECODER IN NAND TYPE FLASH MEMORY DEVICE

BACKGROUND OF THE INVENTION

1. Field of the Invention

The invention relates generally to a NAND type flash memory device, and more particularly to, a word line decoder having a switch structure for applying a negative voltage to a word line, and transistors.

2. Description of the Prior Art

A NAND type flash memory device, one of non-volatile semiconductor memory devices, has a level of integration and a memory capacity corresponding to DRAM. Due to these advantages, the NAND type flash memory device has been increasingly used. The NAND type flash memory device has basically a structure in which a memory string where a plurality of memory cells are serially connected is serially connected between a bit line and a source line. A plurality of the memory cells are arranged to form a memory cell array. The memory cells connected to one word line with the memory string intervened them form a page unit or a byte unit. In order to perform a read operation or a write operation by selecting a given cell of the flash memory device, a corresponding cell is selected by word line and bit line select signals. The decoder for selecting the word line is called a word line decoder.

A conventional word line decoder and memory cell will be below described by reference to FIG. 1 and FIG. 2.

FIG. 1 is a structure of the conventional word line decoder and memory cell. The structure includes a row decoder & charge pump 10, a block-driving unit 12 and a memory cell array 14.

Referring now to FIG. 1, a region of a memory cell array 14 is divided into a plurality of cell blocks. One cell block includes a plurality of strings. At this time, each of the strings is intervened between one bit line B/L and a common source line. One cell block includes a string select line SSL, a plurality of word lines W/L and a ground select line GSL. Also, the block-driving unit 12 includes a string control line SS, a plurality of word control lines S, a ground control line GS and a plurality of transistors for driving the blocks. The plurality of the transistors are controlled by the row decoder & charge pump 10 to control only one cell block. The transistor includes one string driving transistor connected to the string control line SS, a plurality of word driving transistors connected to the word control lines S, and one ground driving transistor connected to the ground control line GS.

A method of driving the NAND type flash memory device shown in FIG. 1 will be below explained.

For example, if a desired cell transistor at the cell array 14 region is to be selectively programmed, 0V is applied to a semiconductor substrate in which the cell array 14 region is formed, that is, the bulk region and the common source line of the cell transistor. Also, 0V is applied to the bit line and the ground control line connected to the selected cell transistor. At this time, a program inhibition voltage is applied to all of not-selected bit lines. Also, a program voltage is applied to the word control line connected to the selected cell transistor. A voltage that is sufficiently higher than the program voltage applied to the word control line, is applied to the transistor of the block driving unit 12, so that the block driving transistors can be sufficiently turned on. That is, the string driving transistors, the word driving transistors and the ground driving transistor are all turned on. At this time, a program operation for the selected cell transistor is performed by means of a F-N tunneling current. Program inhibition of the not-selected cell transistors is performed by means of a self-boosting phenomenon.

FIG. 1 will be further explained by reference to FIG. 2.

FIG. 2 is a detailed circuit diagram of the word line decoder shown in FIG. 1. The word line decoder includes a row decoder 20, a high-voltage control circuit 22 and a driving transistor 24.

The row decoder 20 includes a first NAND gate NAND1 and a first NOR gate NOR1. An output of the first NAND gate is inputted to the first NOR gate NOR1 and an output of the first NOR gate NOR1 is inputted to the high-voltage control circuit 22. An address signal (ADx) for selecting the block is applied to the first NAND gate NAND1 of the row decoder 20. A signal (Select_LeftRight) for selecting a given plain along with the output signal of the first NAND gate is inputted to the first NOR gate NOR1. Therefore, if a given cell is selected, the output of the row decoder 20 becomes HIGH. If the cell is not selected, the output of the row decoder 20 becomes LOW.

The high-voltage control circuit 22 includes a second NAND gate NAND2, transistors M1, M2, M3, M5, an inverter INV1 and capacitors C1, C2. An output signal of the row decoder 20 and the clock signal (CLK) are inputted to an input of the second NAND gate NAND2. A power supply voltage (Vcc) is applied to the gate of the transistor M1, and a voltage Vpp that is same to or lower than the power supply voltage is applied to one inputs of the transistors M3 and M5.

The driving transistors 24 includes a string driving transistor connected to the string control line SS, a plurality of cell transistors connected to the word control lines S, and a ground driving transistor connected to the ground control line GS. The driving transistors may be implemented using NMOS.

In the above, if the output of the row decoder 20 is HIGH, the high-voltage control circuit 22 outputs (Vpp+Vtn) using the clock signal (CLK). At this time, Vtn is the threshold voltage of the driving transistors 24. Therefore, the driving transistors 24 are turned on. If the positive voltage is applied to the string control line SS, the word control lines S and the ground control line GS, Vtn is applied to the string select line SSL, the word lines WL and the ground select line GSL. The capacitors C1, C2 serve to boost the applied Vpp in order to make it (Vpp+Vtn). If the output of the row decoder is LOW, the output of the second NAND gate NAND2 is regardless of the clock signal (CLK) and the capacitors C1, C2 do not serve to boost Vpp. Therefore, as LOW inputted from the row decoder 20 is intact outputted through transistor M1, the driving transistors 24 is turned off. Also, the positive voltage applied to the string control line SS, the word control lines S and the ground control line GS is not transferred to the string select line SSL, the word lines WL and the ground select line GSL.

The conventional word line decoder can apply only the positive voltage to the memory cell array. This is because only the positive voltage can be applied to the string control line SS, the word control lines S and the ground control line GS of the driving transistors 24 but the negative voltage could not be applied to them.

A reason that the negative voltage could not be applied to the driving transistors 24 will be below described by reference to FIG. 3. FIG. 3 is a cross sectional view of the flash memory cell in which the negative voltage is applied to the driving transistors shown in FIG. 2. If the driving transistor is to be implemented using NMOS, a P well is grounded. If −10V of the negative voltage is applied to the source S, the NMOS transistor does not properly operate due to a forward condition of the PN junction.

Therefore, in the conventional NAND type flash memory device, the program, erase and read operations could have been performed for the memory cell selected using the positive voltage only. In particular, as higher voltage is used during the erase operation than during the program operation, a stress is applied to not-selected blocks due to a well bias. There is a problem that data of the memory cell is distorted.

SUMMARY OF THE INVENTION

The present invention is contrived to solve the above problems and an object of the present invention is to provide a word line decoder in a NAND type flash memory device in which a negative voltage can be applied to word lines of the flash memory cell.

In order to accomplish the above object, the word line decoder in the NAND type flash memory device, for decoding a word line select signal by which a given memory cell is selected comprises a row decoder for receiving an address of the given memory cell to produce a signal informing that the given memory cell is selected or not selected, a control unit for outputting a positive voltage if the signal informing that the given memory cell was selected from the row decoder is received and for outputting a negative voltage if the signal informing the given memory cell was not selected is received, and a driving unit having NMOS transistors for outputting the negative voltage inputted to sources of the NMOS transistors to drains of the NMOS transistors if the positive voltage outputted from the control unit is applied to gates of the NMOS transistors, and for prohibiting the negative voltage inputted to the sources from being outputted to the drains if the negative voltage outputted from the control unit is applied to the gates of the NMOS transistors, wherein the negative voltage inputted to the sources of the NMOS transistors is applied to a P well of the NMOS transistors.

In order to accomplish the object, the control unit comprises an inverter connected between a first input terminal and a first node, for inverting an input signal, a first NMOS transistor connected between the first node and a second node, wherein a gate of the first NMOS transistor is connected to the power supply voltage, a first PMOS transistor connected between the first node and a third node, wherein a gate of the first PMOS transistor is connected to the ground, a second PMOS transistor connected between the second node and a second input terminal, wherein a gate of the second PMOS transistor is connected to an output terminal, a second NMOS transistor connected between the third node and a third input terminal, wherein a gate of the second NMOS transistor is connected to the output terminal, a third PMOS transistor connected between the second input terminal and the output terminal, wherein a gate of the third PMOS transistor is connected to the second node, and a third NMOS transistor connected between the third input terminal and the output terminal, wherein a gate of the third NMOS transistor is connected to the third node.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
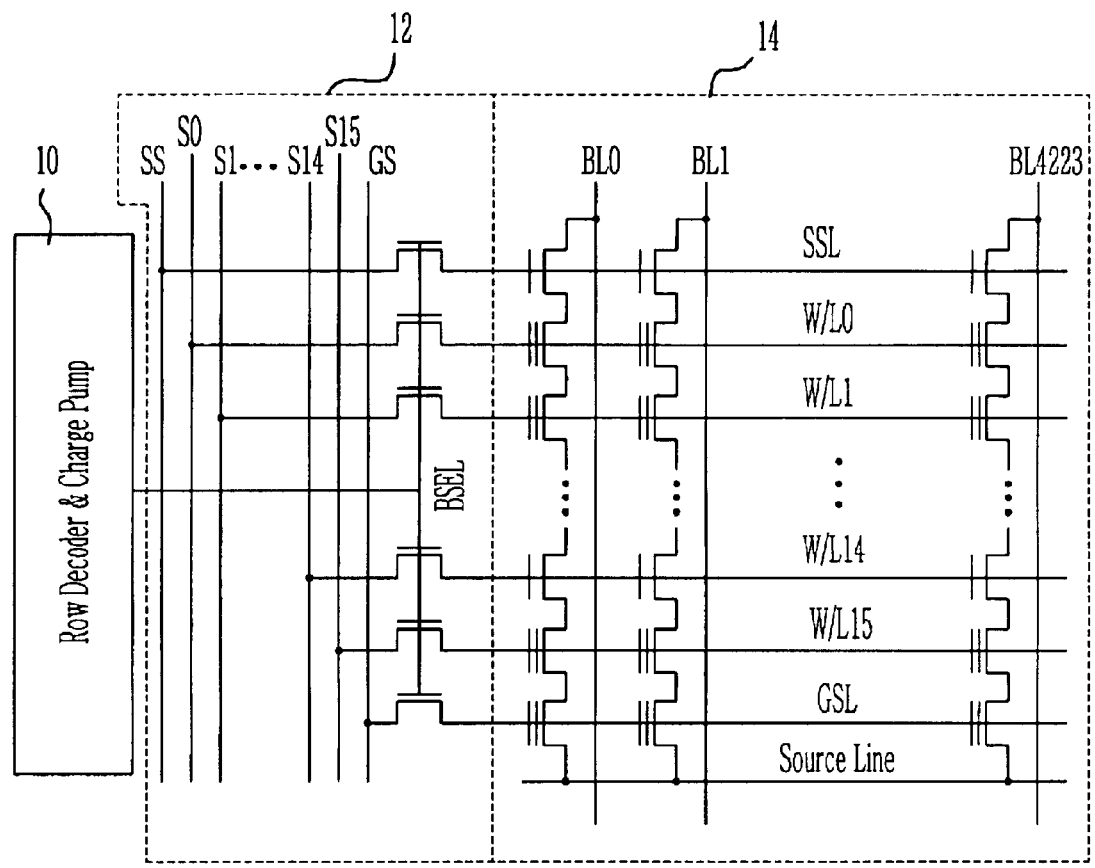
FIG. 1 is a structure of a conventional word line decoder and memory cell.
Figure 3:
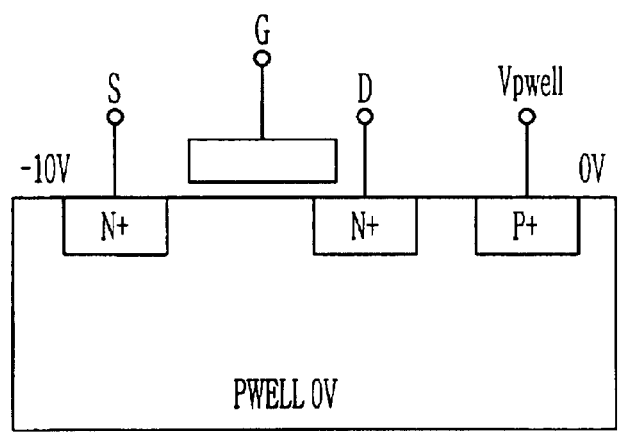
FIG. 3 is a cross sectional view of a flash memory cell in which a negative voltage is applied to the driving transistors shown in FIG. 2.
Figure 2:
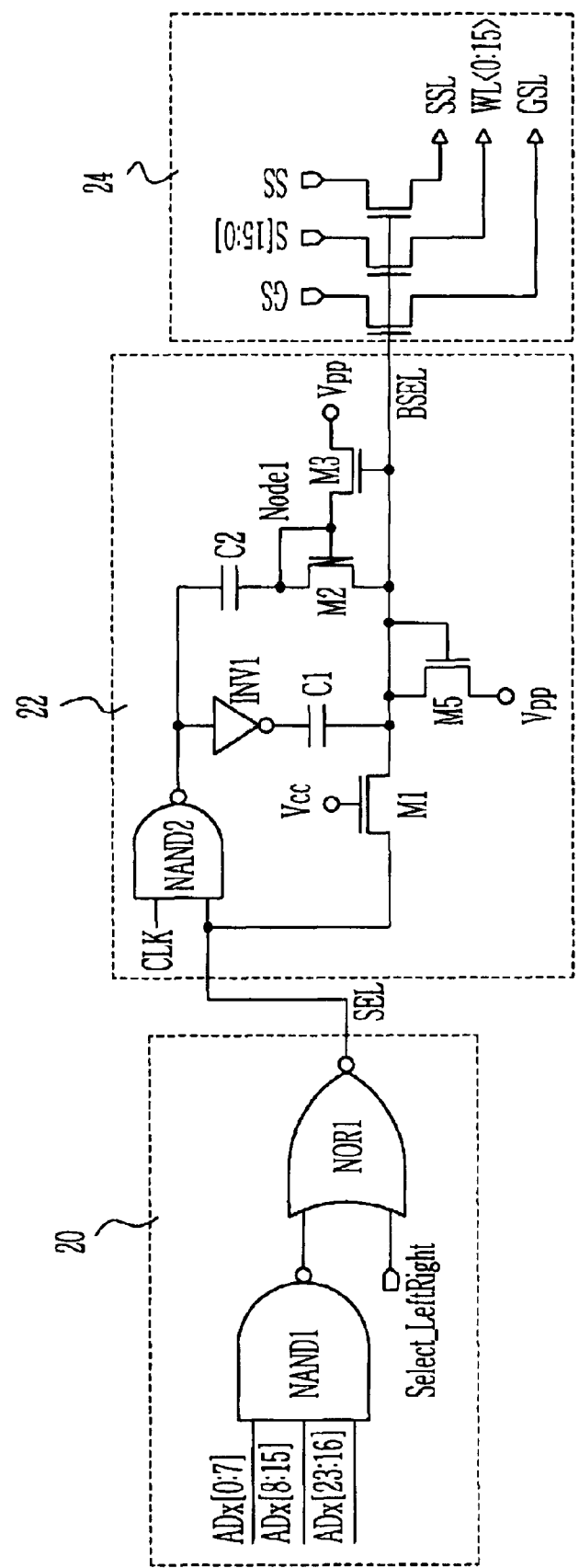
FIG. 2 is a detailed circuit diagram of the word line decoder shown in FIG. 1.

The present invention will be described in detail by way of a preferred embodiment with reference to accompanying drawings, in which like reference numerals are used to identify the same or similar parts.

Figure 4:
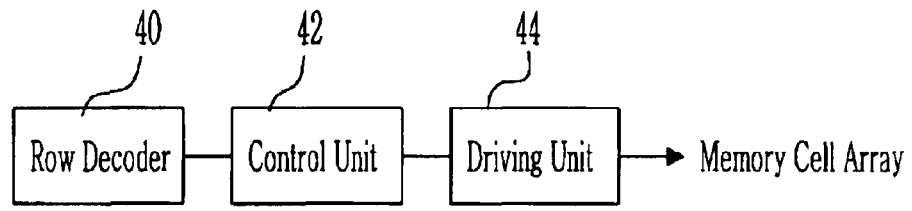
FIG. 4 is a block diagram of a word line decoder in a NAND type flash memory device according to a preferred embodiment of the present invention.

FIG. 4 is a block diagram of a word line decoder in a NAND type flash memory device according to a preferred embodiment of the present invention. The word line decoder includes a row decoder 40, a control unit 42 and a driving unit 44.

The word line decoder in the NAND type flash memory device serves to decode a word line select signal for a selected memory cell in order to perform a specific operation such as a read operation or a write operation for the specific memory cell of the memory cell array.

The row decoder 40 receives an address of a given memory cell to output a signal informing that a given memory cell is selected or not selected. If a given memory cell is selected, the row decoder 40 outputs HIGH. The row decoder 40 may output LOW for other not-selected memory cells. At this time, the given memory cell is a predetermined memory cell in the apparatus for processing the operation of the flash memory device. For example, if a second cell transistor in a first string is to be programmed, the second word line must be selected. If an address corresponding to the second word line is inputted, the row decoder 40 outputs a signal of HIGH. The row decoder 40 outputs LOW for the remaining word lines. The output signal of the row decoder 40 is inputted to the control unit 42. The output signal of the control unit 42 is inputted to the driving unit 44. Also, the driving unit 44 is connected to the transistor of each of the memory cells, so that the transistor of each of the memory cells can perform an operation depending on the signal of the driving unit 44.

The control unit 42 will be below described. The control unit 42 serves to control the transistor of the driving unit 44. If the control unit 42 is informed of a fact that a given memory cell is selected from the row decoder 40, the control unit 42 outputs a positive voltage to the driving unit 44. On the contrary, if the control unit 42 is informed of a fact that the given memory cell is not selected from the row decoder 40, the control unit 42 outputs a negative voltage to the driving unit 44.

Figure 5:
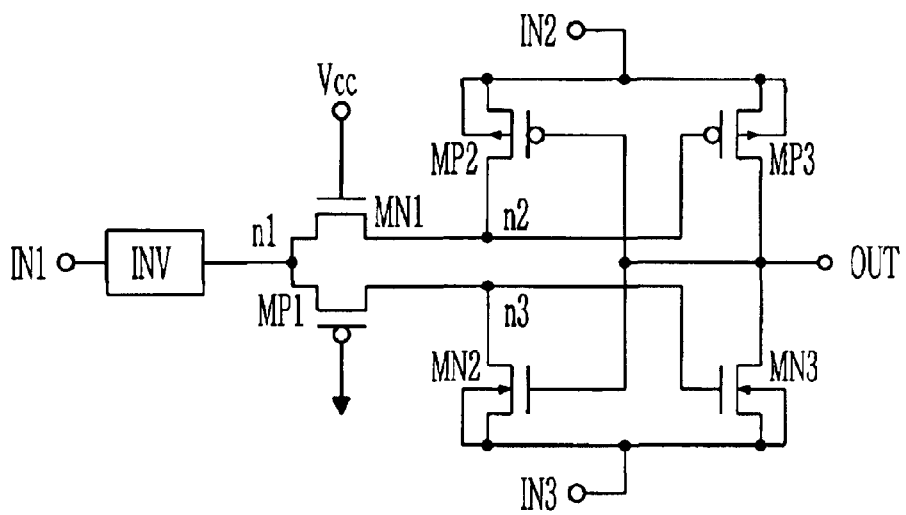
FIG. 5 is a detailed circuit of the control unit shown in FIG. 4 according to a preferred embodiment of the present invention.

FIG. 5 is a detailed circuit of the control unit 42 shown in FIG. 4 according to a preferred embodiment of the present invention. The control unit 42 includes an inverter INV, PMOS transistors MP1, MP2, MP3, and NMOS transistors MN1, MN2, MN3.

Referring to FIG. 5, the inverter INV is connected between a first input terminal IN1 and a first node n1. The first NMOS transistor MN1 is connected between the first node n1 and a second node n2. The power supply voltage (Vcc) is applied to a gate of the first NMOS transistor MN1. A first PMOS transistor MP1 is connected between the first node n1 and a third node n3. A gate of the first PMOS transistor MP1 is grounded. A second PMOS transistor MP2 is connected to the second node n2. A second input terminal IN2 is connected to the other side of the second PMOS transistor MP2. A positive voltage is applied to the second input terminal IN2. For example, $V_{PPX}$, a voltage higher than the power supply voltage may be applied to the second input terminal IN2. A gate of the second PMOS transistor MP2 is connected to an output terminal OUT. The second NMOS transistor MN2 is connected between the third node n3 and the third input terminal IN3. A gate of the second NMOS transistor (NM2) is connected to the output terminal OUT. The negative voltage, for example $V_{EEX}$ may be applied to the third input terminal IN3. The third PMOS transistor MP3 is connected between the second input terminal IN2 and the output terminal OUT. A gate of the third PMOS transistor MP3 is connected to the second node n2. The third NMOS transistor MN3 is connected between the third input terminal IN3 and the output terminal OUT. A gate of the third NMOS transistor MN3 is connected to the third node n3.

The inverter INV inverts a signal inputted from the input terminal. Thus, if the signal inputted to the inverter INV from the row decoder 40 through the first input terminal IN1 is HIGH, the inverter INV outputs a LOW signal. If the signal inputted to the inverter INV from the row decoder 40 through the first input terminal IN1 is LOW, the inverter INV outputs a HIGH signal.

Figure 6:
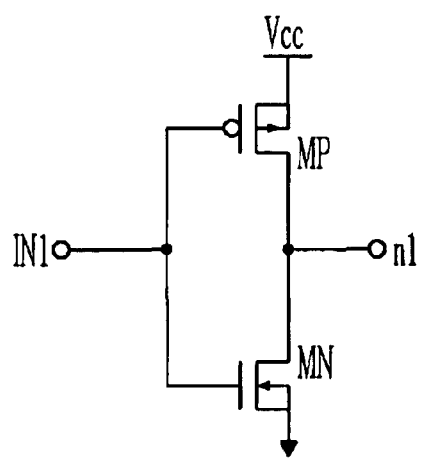
FIG. 6 is a circuit diagram for implementing the inverter shown in FIG. 5.

A circuit that implements the inverter INV is shown in FIG. 6.

Referring now to FIG. 6, a PMOS transistor (MP) is connected between the power supply voltage (Vcc) and the first node n1. A gate of the PMOS transistor (MP) is connected to the first input terminal IN1. Also, a NMOS transistor MN is connected between the first node n1 and the ground. A gate of the NMOS transistor MN is connected to the first input terminal IN1. If the signal inputted through the first input terminal IN1 is HIGH, the NMOS transistor MN is turned on but the PMOS transistor (MP) is turned off. Thus, the ground voltage, i.e., LOW is outputted to the first node n1. However, if the signal inputted through the first input terminal IN1 is LOW, the NMOS transistor MN is turned off but the PMOS transistor (MP) is turned on. Thus, the power supply voltage, i.e., HIGH is outputted to the first node n1. In other words, the inverter circuit serves to invert the signal inputted through the first input terminal IN1.

One embodiment of implementing the control unit 42 will be explained by reference to FIG. 5 again.

If HIGH is inputted through the first input terminal IN1, the first node n1 becomes LOW. As the power supply voltage is applied to the gate of the first NMOS transistor MN1 and the gate of the first PMOS transistor MP1 is grounded, the first NMOS transistor MN1 and the first PMOS transistor MP1 are turned on. The LOW signal of the first node n1 is thus applied to the gate of the third PMOS transistor MP3 through the second node n2, so that the third PMOS transistor MP3 is turned on. Also, the positive voltage inputted through the second input terminal IN2, for example $V_{PPX}$ is outputted through the output terminal OUT. However, the LOW signal of the first node n1 is applied to the gate of the third NMOS transistor MN3 through the third node n3, so that the third NMOS transistor MN3 is turned off. Also, the negative voltage inputted through the third input terminal IN3, for example $V_{EEX}$ is not outputted through the output terminal OUT.

On the contrary, if LOW is inputted through the first input terminal IN1, the first node n1 becomes HIGH. As the power supply voltage is applied to the gate of the first NMOS transistor MN1 and the gate of the first PMOS transistor MP1 is grounded, the first NMOS transistor MN1 and the first PMOS transistor MP1 are turned on. If HIGH is applied to the gate of the third PMOS transistor MP3 through the second node n2, the third PMOS transistor MP3 is turned off. However, if HIGH is applied to the gate of the third NMOS transistor MN3 through the third node n3, the third NMOS transistor MN3 is turned on. Also, the negative voltage inputted through the third input terminal IN3, for example $V_{EEX}$ is outputted to the output terminal OUT. As the output terminal OUT is connected to the gates of the second PMOS transistor MP2 and the second NMOS transistor MN2, $V_{EEX}$ is applied to both the gates of them. As $V_{EEX}$ should not be applied to other not-selected transistors, $V_{EEX}$ should be applied to the gate of the third NMOS transistor MN3 and $V_{EEX}$ should be applied to the third node n3. Thus, $V_{EEX}$ is applied to the source and gate of the third NMOS transistor MN3, so that the third NMOS transistor MN3 is turned off. In other words, the second NMOS transistor MN2 serves to turn off the third NMOS transistor MN3.

An operation of the control unit 42 will be described by reference to FIG. 7.

Figure 7A:
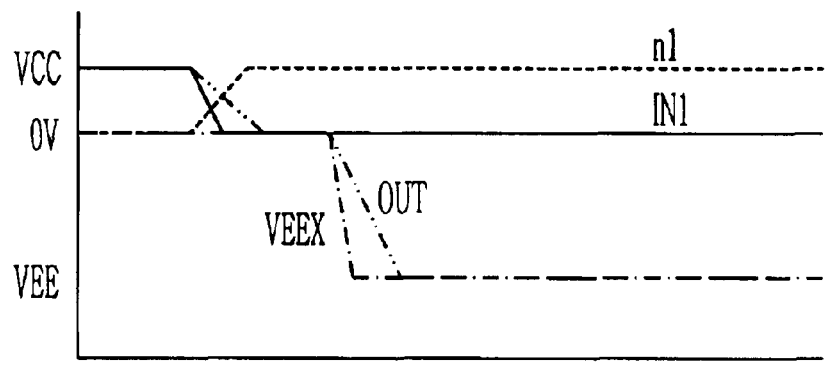
FIG. 7 is a waveform for explaining an output signal of the control unit depending on an input signal.
Figure 7B:
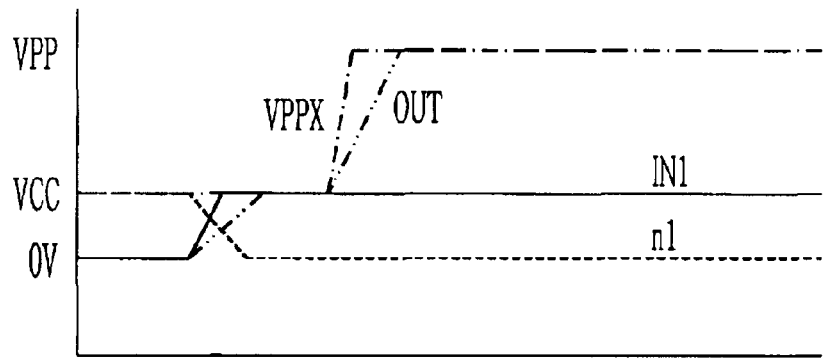

FIG. 7 is a waveform for explaining the output signal of the control unit 42 depending on the input signal. FIG. 7A is a waveform when the input of the first input terminal IN1 is LOW and FIG. 7B is a waveform when the input of the first input terminal IN1 is HIGH.

Referring now to FIG. 7A, if a signal inputted through the first input terminal IN1 is LOW, the voltage of the first node n1 becomes the power supply voltage (Vcc) of HIGH. Thus, it can be seen that $V_{EEX}$ being the voltage inputted through the third input terminal IN3 is outputted through the output terminal OUT of the control unit.

Refereeing to FIG. 7B, if the signal inputted through the first input terminal IN1 is HIGH, the voltage of the first node n1 becomes the ground voltage of LOW. Thus, it can be seen that the voltage $V_{PPX}$ inputted through the second input terminal IN2 is outputted through the output terminal OUT of the control unit.

An operation and structure of the driving unit 44 in FIG. 4 will be described.

The driving unit 44 includes a NMOS transistor. If the positive voltage applied from the control unit 42 is applied to the gate of the NMOS transistor, the NMOS transistors is turned on so that it outputs the negative voltage inputted to the source of the NMOS transistor to the memory cell. If the negative voltage is applied to the gate of the NMOS transistor from the control unit 42, the NMOS transistors is turned off, so that it prohibits the negative voltage inputted to the source of the NMOS transistor from being outputted to the memory cell. Also, the same voltage to the negative voltage applied to the source of the NMOS transistor is applied to the P well of the NMOS transistor.

Figure 8:
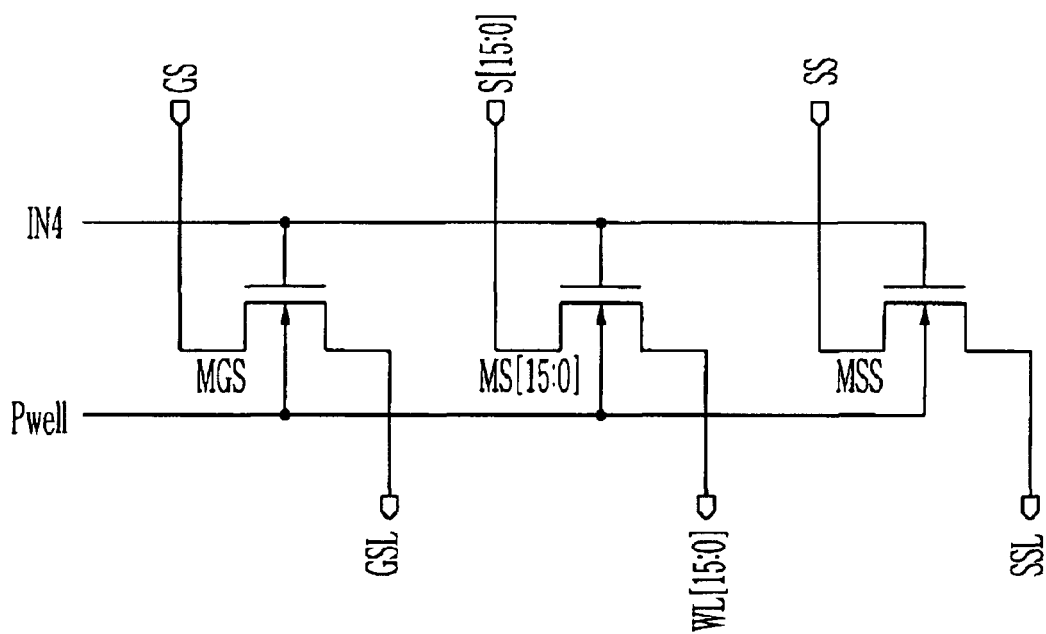
FIG. 8 is a circuit diagram of the driving unit shown in FIG. 4 according to a preferred embodiment of the present invention.

FIG. 8 is a circuit diagram of the driving unit shown in FIG. 4 according to a preferred embodiment of the present invention.

The NMOS transistors includes a ground select transistor MGS for transferring the voltage applied to a ground control line GS to a ground select line GSL, cell transistors MS for transferring the voltage applied to word control lines S to word lines WL, and a string select transistor MSS for transferring the voltage applied to a string control line SS to a string select line SSL. In order to transfer the negative voltage to the word line of the memory cell, a negative voltage, for example $V_{EEX}$ is applied to the ground control line GS, the word control lines S and the string control line SS, and $V_{EEX}$ being a negative voltage is also applied to the P well of the transistor. Each of the output signals of the control unit 42 is applied to the gate of each of the transistors through the fourth input terminal (IN4).

If the output of the row decoder 40 is HIGH and the output of the control unit 42 is $V_{PPX}$, the NMOS transistor of the driving unit 44 is turned on. Thus, $V_{EEX}$ applied to the string control line SS, the word control lines S and the ground control line GS is transferred to the string select line SSL, the word lines WL and the ground select line GSL. However, if the output of the row decoder 40 is LOW and the output of the control unit 42 is $V_{EEX}$, the NMOS transistor is turned off. Thus, $V_{EEX}$ applied to the string control line SS, the word control lines s and the ground control line GS is not transferred to the string select line SSL, the word lines WL and the ground select line GSL. Therefore, the negative voltage can be applied to the word line of the selected memory cell by the row decoder. $V_{EEX}$ being the same negative voltage to that applied to the string control line SS, the word control lines S and the ground control line GS is applied to the P well of the NMOS transistor implementing the driving unit 44. This is for the purpose of preventing mal-function of the transistor since the PN junction portion becomes a forward bias. The NMOS transistor of this driving unit 44 can be formed to have a triple well structure, which will be explained by reference to FIG. 9.

Figure 9:
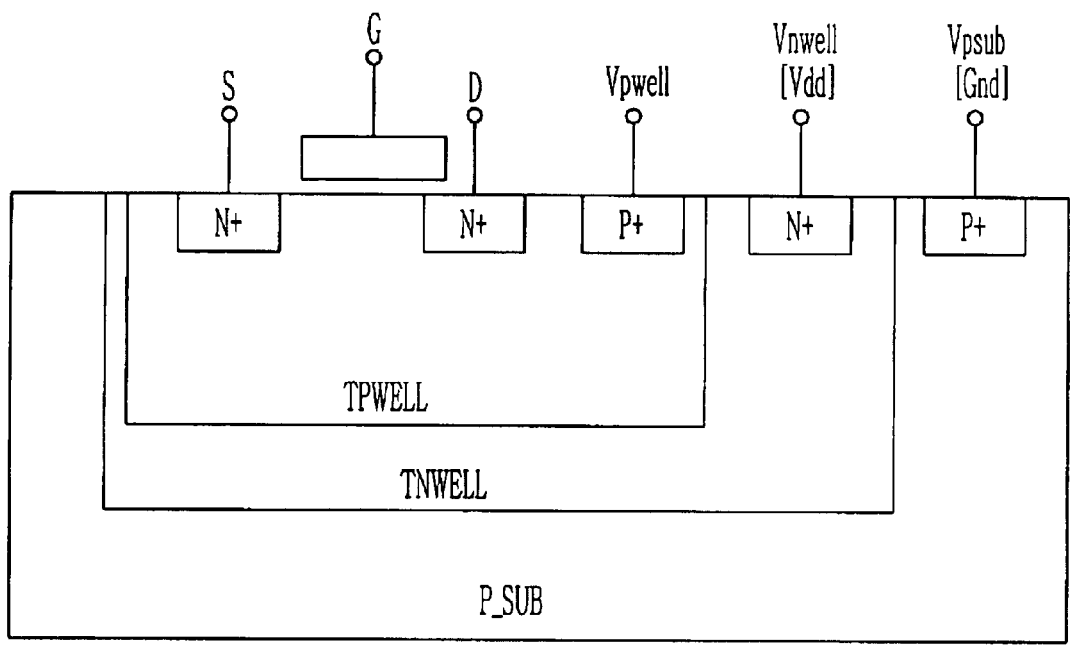
FIG. 9 is a cross sectional view of the NMOS transistor shown in FIG. 8 for explaining triple well structures of the transistors.

FIG. 9 is a cross sectional view of the NMOS transistor of the triple well structure shown in FIG. 8 for explaining triple well structures of the transistors.

A N well TNWELL is formed in a P type substrate P sub. A P well TPWELL is the formed in the N well. A source S and drain D region N+ is formed in the P well TPWELL and a region P+ for applying a voltage to the P well TPWELL is formed in the P well TPWELL. Vdd being the power supply voltage is applied to the N well TNWELL and the P type substrate P SUB is grounded. In order to prevent a forward operation since the P well TPWELL and the region N+in which the source S is formed are PN-junctioned when a negative voltage is applied to the source S, the same negative voltage is applied to the P well. Therefore, the negative voltage applied to the source S can be transferred to the drain D.

As mentioned above, according to the present invention, a negative voltage is applied to the word line of the memory cell. Thus, write or erase operations can be performed for a selected memory cell using the negative voltage. In particular, the present invention has advantageous effects that it can prevent distortion of data by lowering a well bias when the memory cell is erased, and obtain a stable data retention compared to the conventional flash memory device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A word line decoder in a NAND type flash memory device, for decoding a word line select signal by which a given memory cell is selected, comprising:

a row decoder for receiving an address of the given memory cell to produce a signal informing that the given memory cell is selected or not selected;

control unit for outputting a positive voltage if the signal informing that the given memory cell was selected from the row decoder is received and for outputting a negative voltage if the signal informing the given memory cell was not selected is received; and a driving unit having NMOS transistors for outputting the negative voltage from sources of the NMOS transistors to drains of the NMOS transistors if the positive voltage outputted from the control unit is applied to gates of the NMOS transistors, and for prohibiting the negative voltage inputted to the sources of the NMOS transistors from being outputted to the drains of the NMOS transistors if the negative voltage outputted from the control unit is applied to the gates of the NMOS transistors, wherein the negative voltage inputted to the sources of the NMOS transistors is applied to a P well of the NMOS transistors.

2. The word line decoder as claimed in claim 1, wherein the control unit comprises: an inverter connected between a first input terminal and a first node, for inverting an input signal; a first NMOS transistor connected between the first node and a second node, wherein a gate of the first NMOS transistor is connected to the power supply voltage; a first PMOS transistor connected between the first node and a third node, wherein a gate of the first PMOS transistor is connected to the ground; a second PMOS transistor connected between the second node and a second input terminal, wherein a gate of the second PMOS transistor is connected to an output terminal; a second NMOS transistor connected between the third node and a third input terminal, wherein a gate of the second NMOS transistor is connected to the output terminal; a third PMOS transistor connected between the second input terminal and the output terminal, wherein a gate of the third PMOS transistor is connected to the second node; and a third NMOS transistor connected between the third input terminal and the output terminal, wherein a gate of the third NMOS transistor is connected to the third node.

3. The word line decoder as claimed in claim 1, wherein the NMOS transistors of the driving unit have a triple well structure.

4. The word line decoder as claimed in claim 1, wherein the inverter comprises: a PMOS transistor connected between the power supply voltage and the first node, wherein a gate of the PMOS transistor is connected to the first input terminal; and a NMOS transistor connected between the first node and the ground, wherein a gate of the NMOS transistor is connected to the first input terminal.

* * * * *